(12) United States Patent
Amighini et al.

(10) Patent No.: US 9,024,652 B2
(45) Date of Patent: May 5, 2015

(54) ELECTRONIC CIRCUIT AND METHOD FOR TESTING AND KEEPING A MOS TRANSISTOR SWITCHED-OFF

(75) Inventors: Matteo Amighini, Cremona (IT); Andrea Botta, Tradate (IT); Mauro Foppiani, Milan (IT); Vanni Poletto, Casale Monferrato (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 301 days.

(21) Appl. No.: 13/530,419

(22) Filed: Jun. 22, 2012

(65) Prior Publication Data

US 2012/0326756 A1 Dec. 27, 2012

(30) Foreign Application Priority Data

Jun. 23, 2011 (IT) ................. MI2011A1139

(51) Int. Cl.
*H03K 5/153* (2006.01)
*G01R 31/26* (2014.01)

(52) U.S. Cl.
CPC .................. *G01R 31/2621* (2013.01)

(58) Field of Classification Search
CPC ............. G09G 2330/045; H01L 27/0251; H01L 27/0266; H01L 27/0248; H01L 2924/00; H01L 2924/3011; H01L 23/62; H03K 3/00; H03K 5/153
USPC .......... 324/76.11, 158.1, 415–416, 522, 527, 324/537, 763, 765, 762.01–762.09; 327/108, 112, 389, 427, 43, 512, 581, 327/318, 319, 324, 328, 404, 434, 543, 327/546; 257/48
See application file for complete search history.

(56) References Cited

U.S. PATENT DOCUMENTS

| 5,770,947 A | 6/1998 | Brauchle |
| 6,064,249 A * | 5/2000 | Duvvury et al. ............. 327/314 |

(Continued)

FOREIGN PATENT DOCUMENTS

EP 0869370 A1 10/1998

OTHER PUBLICATIONS

Malandruccolo et al. "Novel solution for the built-in gate oxide stress of LDMOS in integrated circuits for automotive applications", European Test Sumposium IEEE 2009, pp. 67-72.

(Continued)

*Primary Examiner* — Arleen M Vazquez
*Assistant Examiner* — Neel Shah
(74) *Attorney, Agent, or Firm* — Allen, Dyer, Doppelt, Milbrath & Gilchrist, P.A.

(57) ABSTRACT

The electronic circuit includes a transistor having a gate terminal, a source terminal and a drain terminal. A resistor has a first terminal connected to the gate terminal and has a second terminal connected to an auxiliary pad. When the electronic circuit is operating in a test phase and is configured for receiving a test signal for performing the test of the transistor, the auxiliary pad is electrically floating. When the electronic circuit is operating in a normal phase and is configured for receiving a supply voltage, the auxiliary pad is electrically connected to a voltage value smaller than the sum of the voltage value of the source terminal with the threshold voltage value of the transistor.

21 Claims, 8 Drawing Sheets

(56) References Cited

U.S. PATENT DOCUMENTS

| | | |
|---|---|---|
| 7,705,600 B1 | 4/2010 | Byrkett |
| 2003/0071662 A1* | 4/2003 | Kwong ........................ 327/112 |
| 2005/0212568 A1* | 9/2005 | Kitagawa et al. ............. 327/112 |
| 2010/0102857 A1* | 4/2010 | Aoki et al. .................... 327/109 |

OTHER PUBLICATIONS

Malandruccolo et al. "New on-chip screening of gate oxides in smart power devices for automotive applications", IEEE 2009, pp. 573-578.

* cited by examiner

ELECTRONIC CIRCUIT AND METHOD FOR TESTING AND KEEPING A MOS TRANSISTOR SWITCHED-OFF

FIELD OF THE INVENTION

The present invention generally relates to the field of electronics. More particularly, the present invention concerns an electronic circuit and a method for testing the oxide of a MOS transistor and for performing the switch-off of the MOS transistor.

BACKGROUND OF THE INVENTION

It is often needed to keep a MOS (Metal-Oxide-Semiconductor) transistor switched-off in the case of a lack of power supply of the electronic device incorporating the MOS transistor and in the case where the drain terminal of the MOS transistor undergoes an abrupt change of voltage. In fact, in this case, the voltage change of the drain terminal is transferred to the gate terminal, due to the parasitic capacitance between the drain and the gate terminals. This variation of the voltage of the gate terminal can switch on the MOS transistor and, especially in case the MOS transistor is used as a switch for an external load in high-power applications, it can damage the MOS transistor.

Referring to FIG. 1A, a known approach for keeping a MOS transistor M switched-off following abrupt changes of the voltage of drain terminal D is to use a pull-down resistor $R_{pd}$ (more in general, a pull-down circuit) connected to the gate terminal G of the MOS transistor M. The pull-down resistor $R_{pd}$ has the function of quickly discharging (for example towards the source S connected to ground) the voltage of the gate terminal G, thereby reducing the effects due to the capacitive coupling between the drain terminal D and the gate terminal G.

It is further needed to perform the test of the gate oxide of the MOS transistor (used for example in high-power applications), to detect defects that may be present at the end of the manufacturing process of the MOS transistor on the silicon wafer, before the phase of wire bonding and of packaging.

Referring to FIG. 1A, a known technique for performing the test of the gate oxide of the MOS transistor M is that referred to as the "gate stress test", which involves three steps. In the first step, the gate terminal G of the MOS transistor M is placed under a high-impedance condition, on the gate terminal G of the MOS transistor M it is forced a value of the test voltage $V_{sp}$ within the typical operational range (via a pad GST connected to the gate terminal G), thus on the pad GST it is measured a first value of the current $IL_1$ which flows in the gate terminal G. In the second step, on the gate terminal G a value of the test voltage $V_{sp}$ outside the typical operational range is forced. In the third step, the gate terminal G of the MOS transistor M is placed again under the high-impedance condition, on the gate terminal G of the MOS transistor M the value of test voltage $V_{sp}$ within the typical operational range is forced (via the pad GST), thus on the pad GST it is measured a second value of current $IL_2$ which flows in the gate terminal G. If the difference between the second value of current $IL_2$ and the first value of current $IL_1$ is negligible, the test of the oxide of the gate G of the MOS transistor M is successful, i.e. the MOS transistor M is considered defect-free; in the opposite case, the MOS transistor M is considered defective.

For further details related to the test of the gate oxide, see for example the following documents: V. Malandruccolo, M. Ciappa, W. Fichtner, "Novel solution for the built-in gate oxide stress of LDMOS in integrated circuits for automotive applications", European Test Sumposium IEEE 2009, pp. 67-72; V. Malandruccolo, M. Ciappa, H. Rothleitner, W. Fichtner, "New on-chip screening of gate oxides in smart power devices for automotive applications", IEEE 2009, pp. 573-578.

Therefore it is necessary to use a circuit which is capable of keeping the MOS transistor switched-off in case of lack of power supply and in case of an abrupt change in the voltage of the drain terminal, and which is, at the same time, capable of performing the test of the gate oxide.

Referring to FIG. 1A, a known technique is to use the pull-down resistor $R_{pd}$ connected between the gate terminal G of the MOS transistor M and ground. In case the supply voltage of the circuit 1 is not present and in case the gate terminal G has a change in the voltage due to a change of the voltage of the drain terminal D, the pull-down resistor $R_{pd}$ has the function to switch-off the MOS transistor M by discharging towards ground the generated current which flows from the gate terminal G towards ground across the pull-down resistor $R_{pd}$. Moreover, a test pad GST connected to the gate terminal G is used, to perform the test of the gate oxide of the MOS transistor M.

It has been observed that a drawback of this typical approach is that it is not optimized, because it requires a trade-off value of the resistance of the pull-down resistor $R_{pd}$. In fact, the test of the gate oxide requires a high value of the resistance to limit the current sink during the test, while switching-off the MOS transistor requires a small value of the resistance to allow the voltage of the gate terminal to be discharged quickly towards ground.

A further known technique for performing the test of the gate oxide of the MOS transistor and for keeping the MOS transistor switched-off is that shown in FIG. 1B. The electronic circuit 50 comprises a pull-down resistor $R_{pd}$, the n-type MOS transistor M', a pnp-type bipolar transistor T and a Zener diode DZ, which are connected as shown in FIG. 1B.

The switch-off of the MOS transistor M' is achieved via the transistor T. In fact, in case of lack of power supply and in case of an abrupt change of the voltage of the drain terminal D' of the MOS transistor M', the transistor T enters into conduction and prevents the gate terminal G' of the MOS transistor M' from reaching voltage values greater than the voltage difference $V_{EB}$ between the emitter E and the base B of the transistor T (for example, $V_{EB}$=0.7 V).

Therefore the MOS transistor M' is switched-off, provided that the threshold voltage $V_{th}$ of the MOS transistor M' is greater than the voltage difference $V_{EB}$. This condition is fulfilled for MOS transistors having a thick gate oxide (i.e. with a oxide thickness greater than 120 Angstrom), but it is not fulfilled for MOS transistors having a thin gate oxide, which are widely used in power devices in the BCD6 technology. Hence, the circuit 50 has the drawback that it is not capable of passively switching-off a MOS with a threshold voltage $V_{th}$ smaller than the voltage difference $V_{EB}$, such as for example MOS transistors having a thin gate oxide (oxide thickness smaller than 120 Angstrom).

SUMMARY OF THE INVENTION

The present invention relates to an electronic circuit that includes a transistor having a gate terminal, a source terminal and a drain terminal. A resistor has a first terminal connected to the gate terminal and has a second terminal connected to an auxiliary pad. When the electronic circuit is operating in a test phase and is configured for receiving a test signal for performing the test of the transistor, the auxiliary pad is electrically floating. When the electronic circuit is operating in a normal phase and is configured for receiving a supply voltage, the auxiliary pad is electrically connected to a voltage value smaller than the sum of the voltage value of the source terminal with the threshold voltage value of the transistor.

The electronic circuit according to the present embodiments may have the following advantages including allowing the use of a pull-down resistor with a low value, and at the same time being capable of performing the test of the gate oxide of the MOS transistor. The circuit can also be used with MOS transistors having a thin oxide gate.

It is a further object of the present embodiments to provide an electronic system comprising at least two electronic circuits with the anodes of the least two electronics circuits being connected to each other and to the auxiliary pad. It is a further object of the present embodiments to provide an integrated circuit including the electronic circuit.

It is an object of the present embodiments to also provide a method for testing and switching-off a transistor. The method includes: providing the transistor having a gate terminal, a source terminal and a drain terminal; providing an auxiliary pad; providing a resistor having a first terminal connected to the gate terminal and having a second terminal connected to the auxiliary pad; activating a test phase, wherein the auxiliary pad is electrically floating; receiving a test signal and performing the test of the transistor; electrically connecting the auxiliary pad to a voltage value smaller than the sum of the voltage value of the source terminal with the threshold voltage value of the transistor; activating a normal phase and driving the gate terminal of the transistor as a function of a supply voltage; after occurring a lack of the supply voltage, in case of an increase of the voltage value on the drain terminal and in case of switching-on the transistor, discharging the voltage value of the gate terminal across the resistor and switching-off the transistor.

BRIEF DESCRIPTION OF THE DRAWINGS

Further characteristics and the advantages of the invention will be clear from the following description of a preferred embodiment and variants thereof provided as a way of example with reference to the appended drawings.

DETAILED DESCRIPTION OF THE PREFERRED EMBODIMENTS

It should be noted that in the present description, components or modules equal or similar are indicated in the figures with the same reference numbers.

Figure 1A:
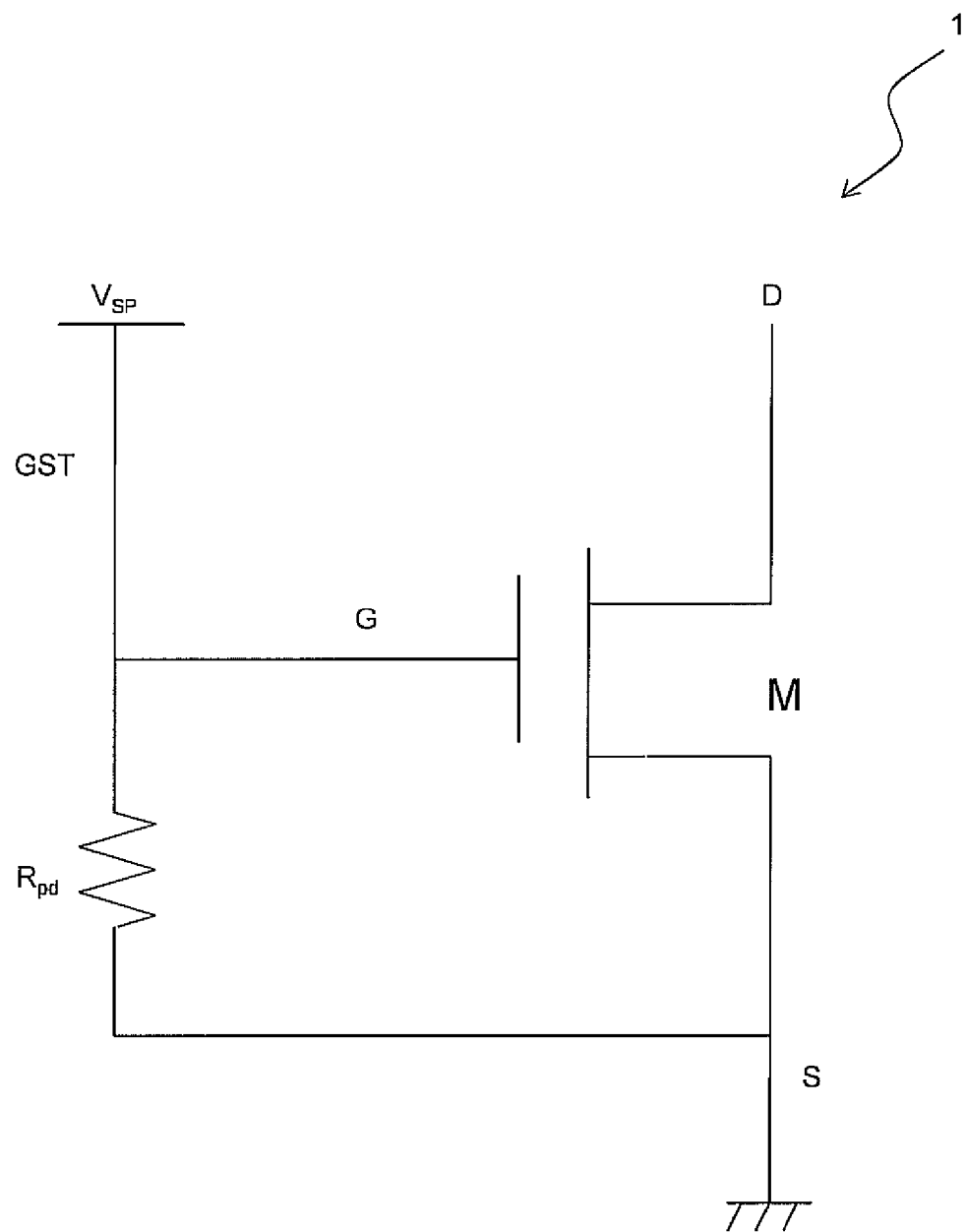
FIG. 1A is a schematic diagram illustrating a known electronic circuit for testing and keeping a MOS transistor switched-off according to the prior art.
Figure 1B:
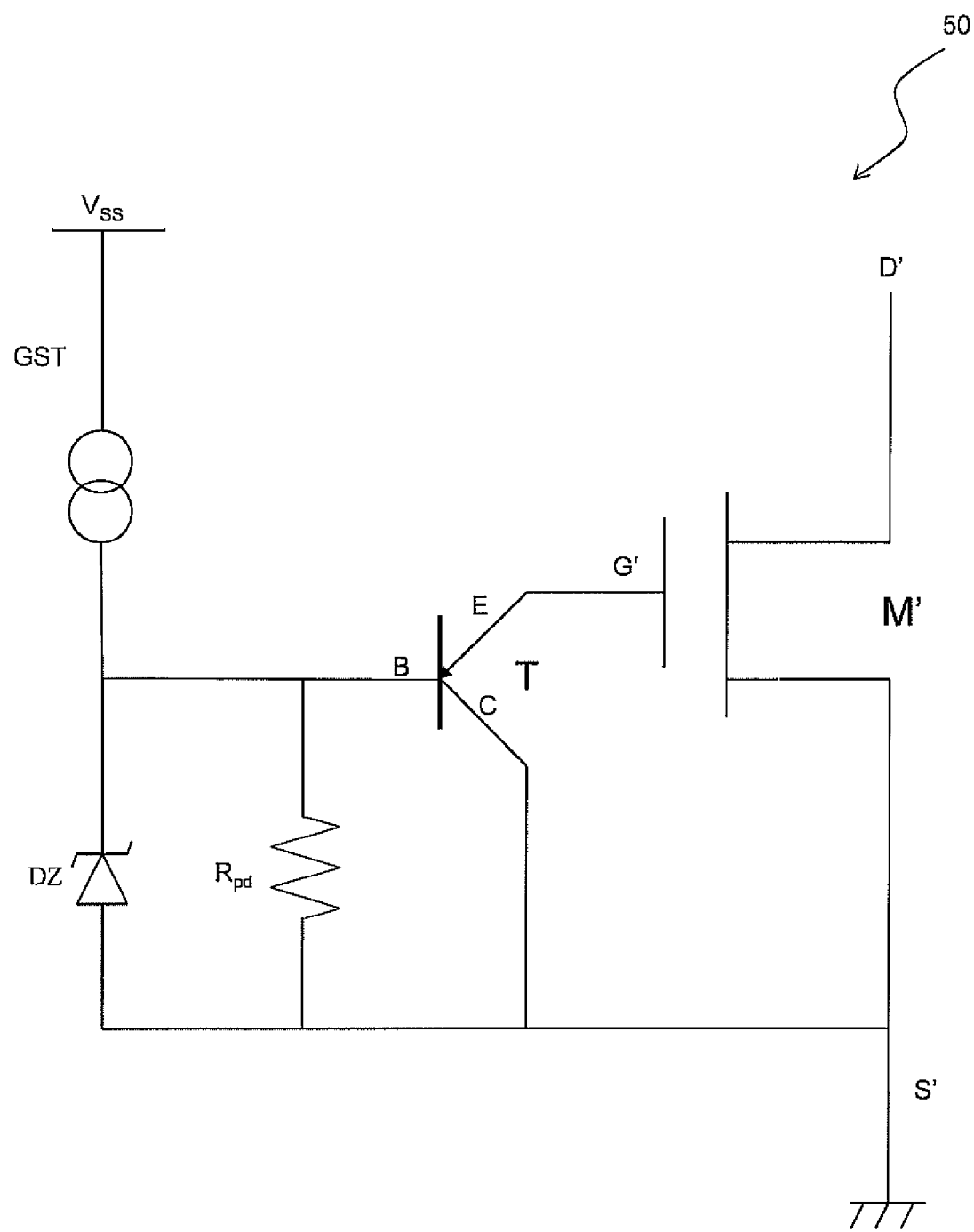
FIG. 1B is a schematic diagram illustrating another known electronic circuit for testing and keeping a MOS transistor switched-off according to the prior art.
Figure 2A:
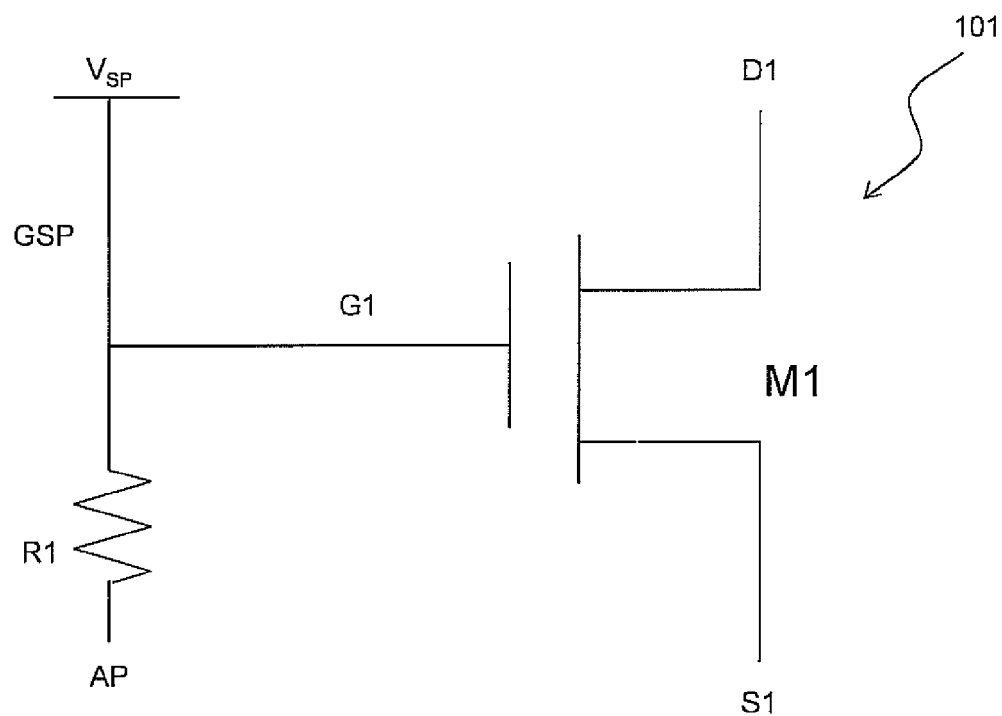
FIGS. 2A and 2B are schematic diagrams showing an electronic circuit for testing and keeping a MOS transistor switched-off according to a first embodiment.
Figure 2B:
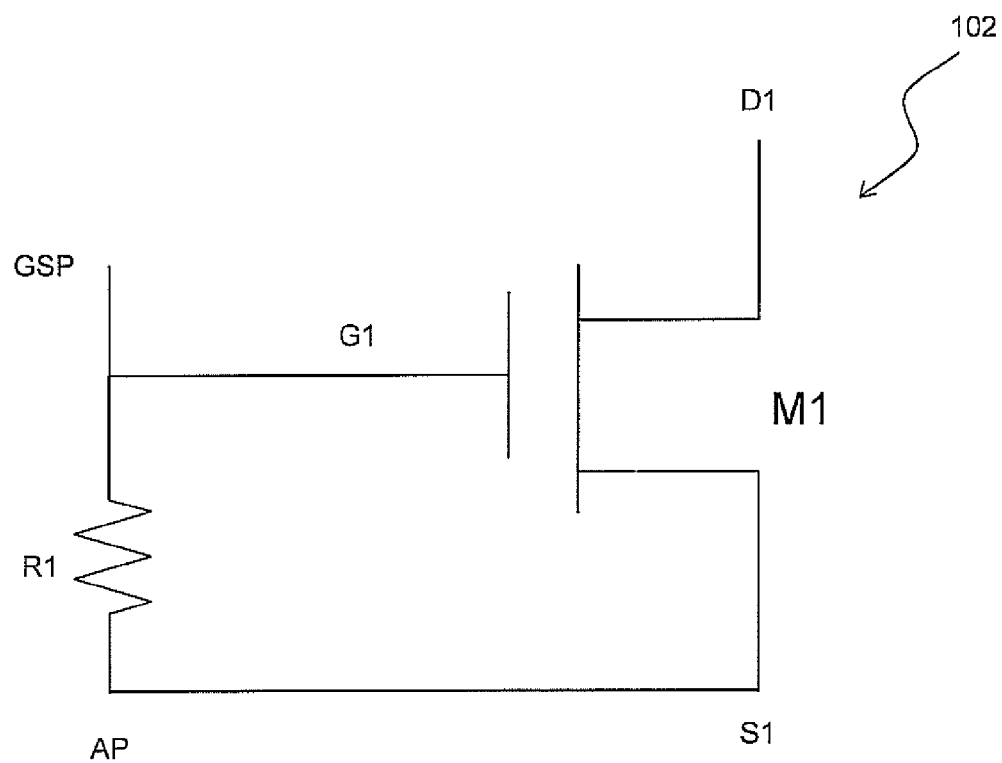

Referring to FIGS. 2A and 2B, an electronic circuit according to the first embodiment is shown in two different time instants. The electronic circuit is indicated with 101 (FIG. 2A) and 102 (FIG. 2B).

The electronic circuit 101, 102 include a n-channel MOS (Metal-Oxide-Semiconductor) transistor M1 having a gate terminal G1, a source terminal S1 and a drain terminal D1. A resistor R1 has a first terminal connected to the gate terminal G1, and a test pad GSP is electrically connected to the gate terminal G1 and to the first terminal of the resistor R1. An auxiliary pad AP is electrically connected to a second terminal of the resistor R1. The electronic circuit 101, 102 represents the same electronic circuit in two different time instants, in a test phase and in a normal operation phase respectively.

The gate terminal G1 of the MOS transistor M1 of the electronic circuits 101, 102 is such to be driven by a driving circuit (not shown in the figures for the sake of simplicity), such as, for example, a driving circuit controlling the voltage of the gate terminal G1 to cause the MOS transistor M1 to operate as a switch, via the switching-on and switching-off of the MOS transistor M1. The drain terminal D1 of electronic circuits 101, 102 is such to be connected to a load, such as, for example (in the automotive field), injectors, relays or LEDs. For the sake of simplicity it is assumed that the source terminal S1 is connected to ground.

In the test phase, the auxiliary pad AP is electrically floating, the electronic circuit 101 is configured to receive the value of test voltage $V_{SP}$ on the test pad GSP and the electronic circuit 101 is such to carry out the test of the oxide of the gate G1, for example via the "gate stress test", as it will be explained in more detail below in the description related to the operation. The test phase is performed at the end of the manufacturing process of the electronic circuit 101 on the silicon wafer, before the phase of "wire bonding" and "packaging".

In the normal operation phase the auxiliary pad AP is electrically connected to the source terminal S1, for example via a wire bonding. The normal operation phase is performed when the electric circuit 102 is used in the application for which it is designed, such as for example when the electronic circuit 102 is implemented into a control unit mounted on a car.

In the normal operation phase and in case wherein the supply voltage of the circuit 102 is present, the MOS transistor M1 is such to be conductive (for example, in the saturation or linear zone) or it is such to be an open circuit, as a function of the value of the voltage generated by the driving circuit of the gate terminal G1. Moreover, in the normal operation phase the circuit 102 is such to operate for keeping the transistor M1 switched-off in case of lack of the supply voltage of the circuit 102 and in case of change in the voltage on the drain terminal D1.

For example, in automotive applications the lack of supply of the circuit 102 may be caused by the car being switched-off, when the driver turns the key in the off position. In general, in a car, the lack of supply of the circuit 102 may be caused by the disconnection between the battery and the supply circuits of the control unit wherein the integrated circuit comprising the circuit 102 is mounted. The change in the voltage of the drain terminal D1 of MOS transistor M1 may be caused, for example, by a short-circuit between wires or towards the battery when the car is switched-off.

The electronic circuit 102 differs from the electronic circuit 101 as in the electronic circuit 102 is present an electric connection between the auxiliary pad AP and the source terminal S1 of the MOS transistor M1, while in the electronic circuit 101 the auxiliary pad AP is electrically floating. This allows the use of a small value of the resistance of the resistor R1 without interfering with the test of the gate oxide of the MOS transistor M1, as it will be explained more in details below relating to the operation of the electronic circuits 101, 102.

It has to be observed that FIG. 2B shows that the auxiliary pad AP is connected to the source terminal S1 of the MOS transistor M1, but more in general the auxiliary pad AP is connected to a voltage value which is smaller than the sum of the voltage value of the source terminal S1 with the threshold voltage value $V_{th}$ of the MOS transistor M1. In this way, the circuit 102 is such to operate in the normal operation phase and in case a supply voltage of the circuit 102 is present, the current value which flows across the resistor R1 is negligible with respect to the current generated by the driving circuit of the gate terminal G1. In other words, the contribution of resistor R1 on the gate terminal G1 is negligible with respect to the contribution of the driving circuit of the gate terminal G1 and the MOS transistor M1 is switched-on or switched-off only as a function of the contribution by the driving circuit of the gate terminal G1. Differently, in case the supply voltage of the circuit 102 is not present and in case the voltage of the drain terminal D1 is such to have an abrupt increase, the contribution of the pull-down resistor R1 is important. In this case, a current is generated, which flows from the gate terminal G1 to the source terminal S1 across the resistor R1, thereby switching-off the MOS transistor M1.

The operation of the electronic circuits 101, 102 according to the first embodiment of the invention will be described, referring also to FIGS. 2A, 2B). For the sake of simplicity it is assumed that the source terminal S1 is connected to ground.

At the starting time, the manufacturing process of the electronic circuit 101 on the silicon wafer is finished, before the phase of "wire bonding" and of "packaging", and the auxiliary pad AP is electrically floating and the test pad GSP is connected to a test voltage $V_{SP}$ generator. The electronic circuit 101 enters the test phase and receives on a test pad GSP the values of the test voltage $V_{SP}$. Then a test of the gate oxide of the MOS transistor M1 is performed, for example, the three steps of the gate stress test are performed. It should be noted that, since the auxiliary pad AP is electrically floating, during the execution of the gate stress test no current flows from the gate terminal G1 across the resistor R1, thus the current flowing across the gate terminal G1 is caused only by the value of the test voltage $V_{SP}$ during the test, thereby allowing the test of the oxide of the gate G1 to be performed and allowing to discriminate very small current values (much smaller than 1 μA), which could indicate potential defects of the oxide of the gate G1. Moreover, a small value of the resistance of the resistor R1 may be used, because the resistor R1 does not affect the test of the oxide of the gate G1 of the MOS transistor M1.

At the end of the gate stress test, the generator of test voltage $V_{SP}$ is removed, i.e. the generator of test voltage $V_{SP}$ is electrically disconnected from the test pad GSP. The test of the gate oxide is assumed to have a positive result, i.e. the MOS transistor M1 is defect-free.

Subsequently, the auxiliary pad AP is electrically connected to the source terminal S1 via a wired connection, thereby obtaining the circuit 102. The connection occurs in the phase of manufacturing of the integrated circuit which is commonly referred to as "wire bonding". The "wire bonding" phase is thus completed and the subsequent phases of the manufacturing process of the integrated circuit are performed wherein the circuit 102 is inserted, such as, for example, into the packaging and encapsulation phases. Subsequently, the electronic circuit 102 is inserted into the application wherein it is designed, for example, into an integrated circuit of a control unit mounted on a car.

Subsequently, the electronic circuit 102 enters the normal operation phase and the supply voltage of the circuit 102 is present (for example, the car is switched-on). The driving circuit of the gate terminal G1 provides a voltage value of the gate terminal G1 which biases the MOS transistor M1 in a saturation zone and thus a current flows between the drain D1 and the source S1. It should be noted that the current flowing in the resistor R1 is negligible with respect to the current with which the driving circuit biases the gate terminal G1.

Subsequently, a lack of the supply voltage of circuit 102 occurs and thus the MOS transistor M1 is switched-off. Subsequently, the voltage of the drain terminal D1 undergoes an increase in value and thus also the voltage of the gate terminal G1 undergoes an increase in value, due to the parasitic capacitance present between the drain terminal D1 and the gate terminal G1. The increase in voltage of the gate terminal G1 is assumed to be greater than the threshold voltage $V_{th}$ of the MOS transistor M1 and thus the MOS transistor M1 switches on. Since the auxiliary pad AP is electrically connected to the source terminal S1 (which is connected to ground), a current is generated by the gate terminal G1 towards ground across the resistor R1 and this current discharges the voltage value of the gate terminal G1 to the null value. In this way the MOS transistor M1 is switched-off. Advantageously, the resistance value of the resistor R1 is small, allowing the switch-off of the transistor M1 in a short time period.

It has to be observed that, for the sake of simplicity, that in the electronic circuit 101, 102 of the first embodiment it is supposed that the source terminal S1 of the transistor M1 is connected to ground, but the embodiments are more in general applicable to a MOS transistor M1 having a source terminal S1 connected to a voltage which is different from zero, provided that the auxiliary pad AP during the normal operation phase is electrically connected to a voltage value smaller than the sum of the voltage value of the source terminal S1 with the value of the threshold voltage $V_{th}$ of the MOS transistor M1.

Figure 3A:
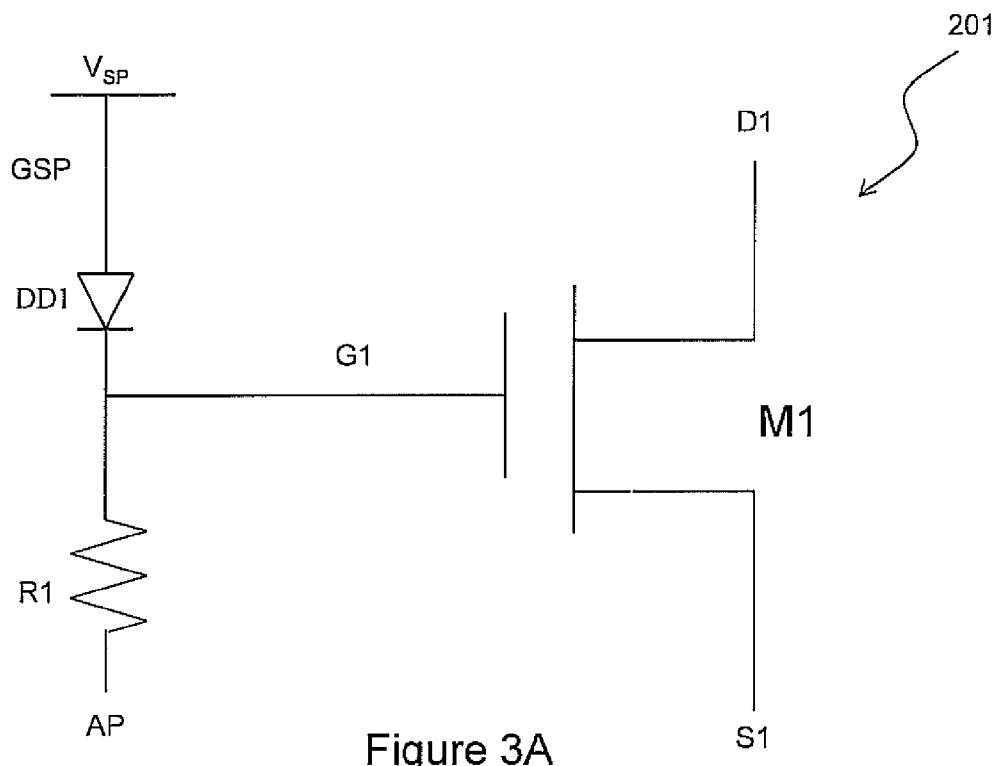
FIGS. 3A and 3B are schematic diagrams showing an electronic circuit for testing and keeping a MOS transistor switched-off according to a variant of the first embodiment.
Figure 3B:
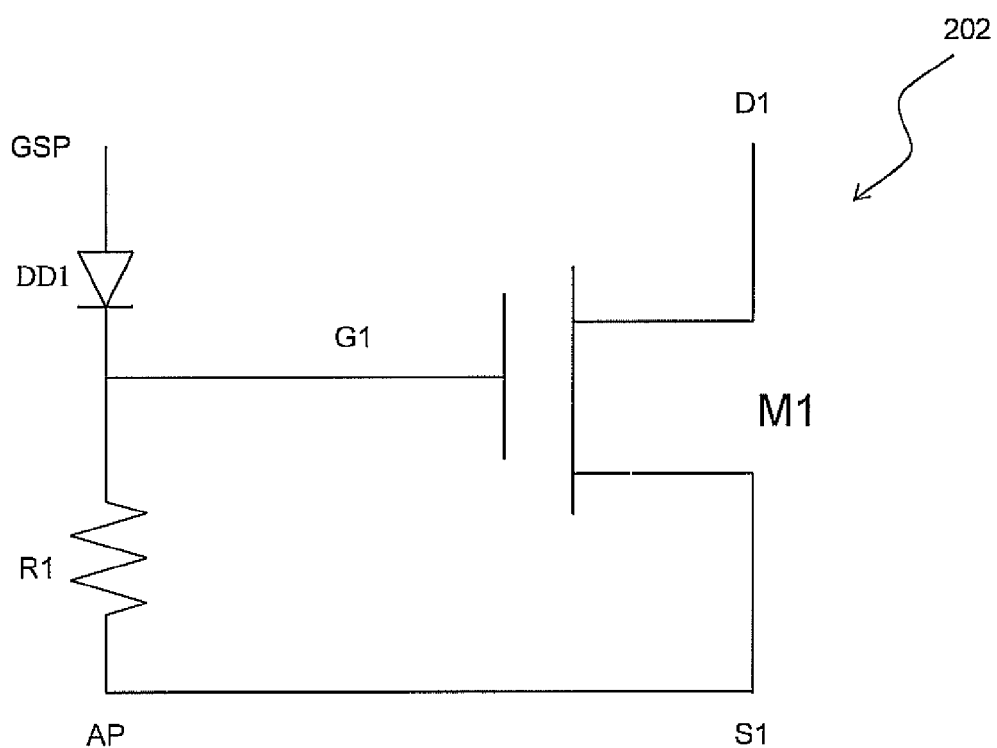

Referring to FIGS. 3A and 3B, the electronic circuits 201, 202 according to a variant of the first embodiment will be described. The electronic circuit 201, 202 differs from the electronic circuit 101, 102 respectively with the presence of a diode DD1 interposed between the gate terminal G1 and the test pad GSP. In particular, the diode DD1 has the cathode connected to the gate terminal G1 and the anode connected to the test pad GSP. The diode DD1 has the function to allow the connection of a plurality N of electronic circuits (each one similar to the circuit 201) to only one test pad GSP, to perform at the same time the test of the gate oxide of a plurality of MOS transistors and further saving an area in the integrated circuit which is equal to (N−1) times the area occupied by the test pad GSP.

The operation of the variant of the first embodiment is the same as the one described for the operation of the first embodiment, with the difference that the diode DD1 is conductive when the circuit 201 is in the test phase and it is switched-off when the circuit 202 is in the normal operation phase.

Figure 4A:
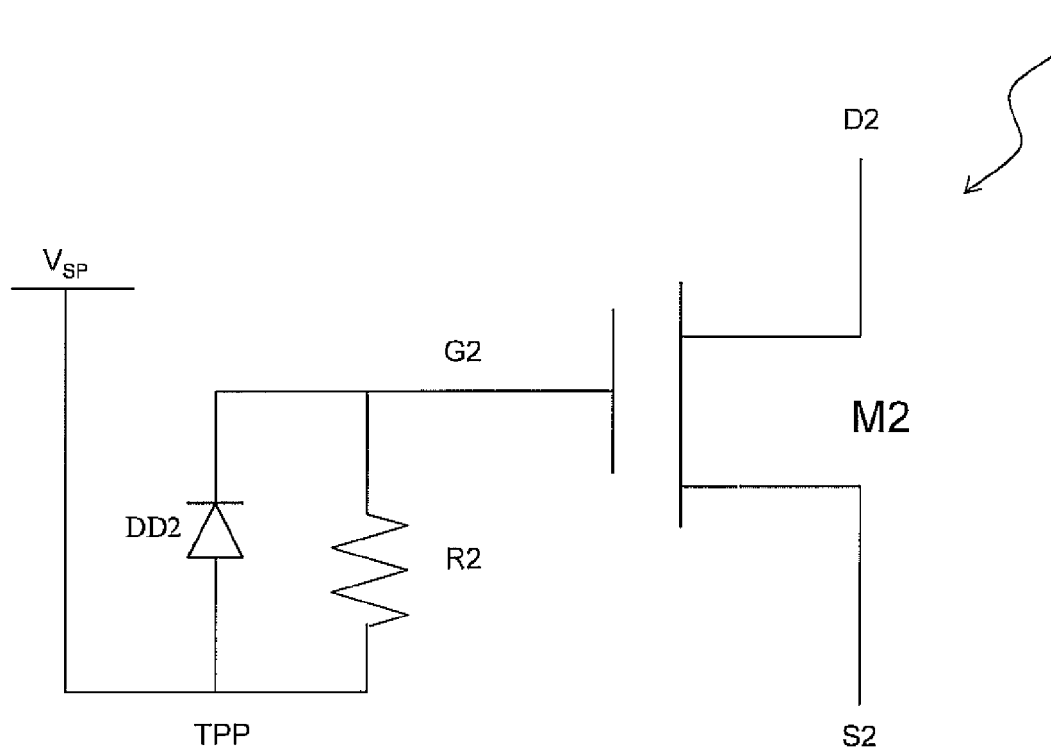
FIGS. 4A and 4B are schematic diagrams showing an electronic circuit for testing and keeping a MOS transistor switched-off according to a second embodiment.
Figure 4B:
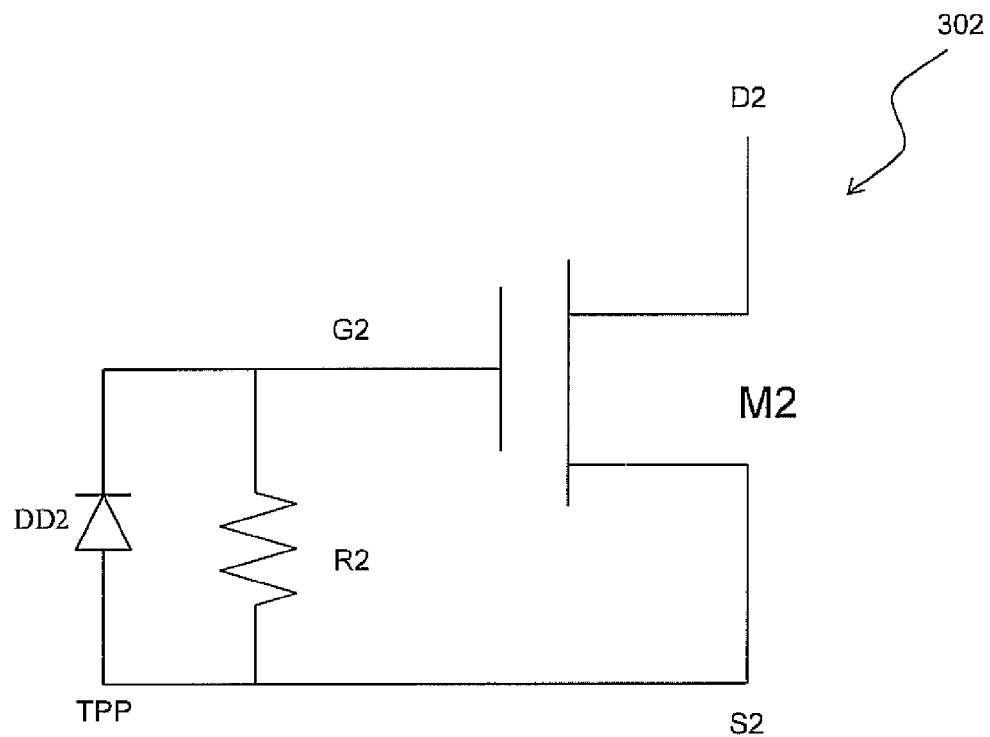

Referring to FIGS. 4A and 4B, the electronic circuits 301, 302 according to the second embodiment are shown. The electronic circuit 301 and 302 represent the same electronic circuit which operates in two different time periods, in the test phase and in the normal operation phase respectively, similar to the first embodiment. The electronic circuit 301, 302, includes an n-channel MOS (Metal-Oxide-Semiconductor) transistor M2 having a gate terminal G2, a source terminal S2 and a drain terminal D2. Also, a test pad TPP is included, a resistor R2 has a first terminal connected to the gate terminal G2 and a second terminal connected to the test pad TPP, and a diode DD2 is connected in parallel to the resistor R2, having the cathode connected to the gate terminal G2 and the anode connected to the test pad TPP.

The electronic circuits 301, 302 of the second embodiment have the advantage (with respect to the electronic circuits 201, 202 of the variant of the first embodiment) to use only one pad TPP both to perform the test of the gate oxide of the MOS transistor M2 in the test phase (wherein the pad TPP is not connected to the source terminal S2), and to connect it to the source terminal S2 in the normal operation phase. This may be obtained because the terminal used to perform the test of the gate oxide and the pull-down resistor R2 are functionally exclusive, i.e. during the test of the gate oxide the operation of the pull-down resistor R2 is not required and during the normal operation the test pad is not accessible.

The operation of the second embodiment is similar to that described for the operation of the first embodiment, with the following differences. When the circuit 301 is in the test phase, the diode DD2 is conductive (i.e. directly biased). Since the test pad TPP is not connected to the source terminal S2, the difference between the test voltage $V_{SP}$ and the voltage drop at the ends of the diode DD2 is applied to the gate terminal G2 of the MOS transistor M2. In the normal operation phase of the circuit 302 and in case the supply voltage of the circuit 302 is present, the diode DD2 is switched-off (i.e. it is inversely biased) and the MOS transistor M2 is switched-on or switched-off as a function of the voltage generated by the driving circuit of the gate terminal G2. In the normal operation phase of the circuit 302, in case the supply voltage of the circuit 302 is not present and in case there is a sudden increase of the voltage of the drain terminal D2 of the MOS transistor M2, the value of the gate terminal G2 voltage increases, the diode DD2 remains switched-off and a current flows from the gate terminal G2 towards ground across the resistor R2, thereby switching-off the MOS transistor M2.

Preferably, the MOS transistor M1 (or M2) is of the LDMOS (Lateral Diffused Metal-Oxide-Semiconductor) type and it has a thin gate oxide (oxide thickness lower than 120 Angstrom).

Figure 5:
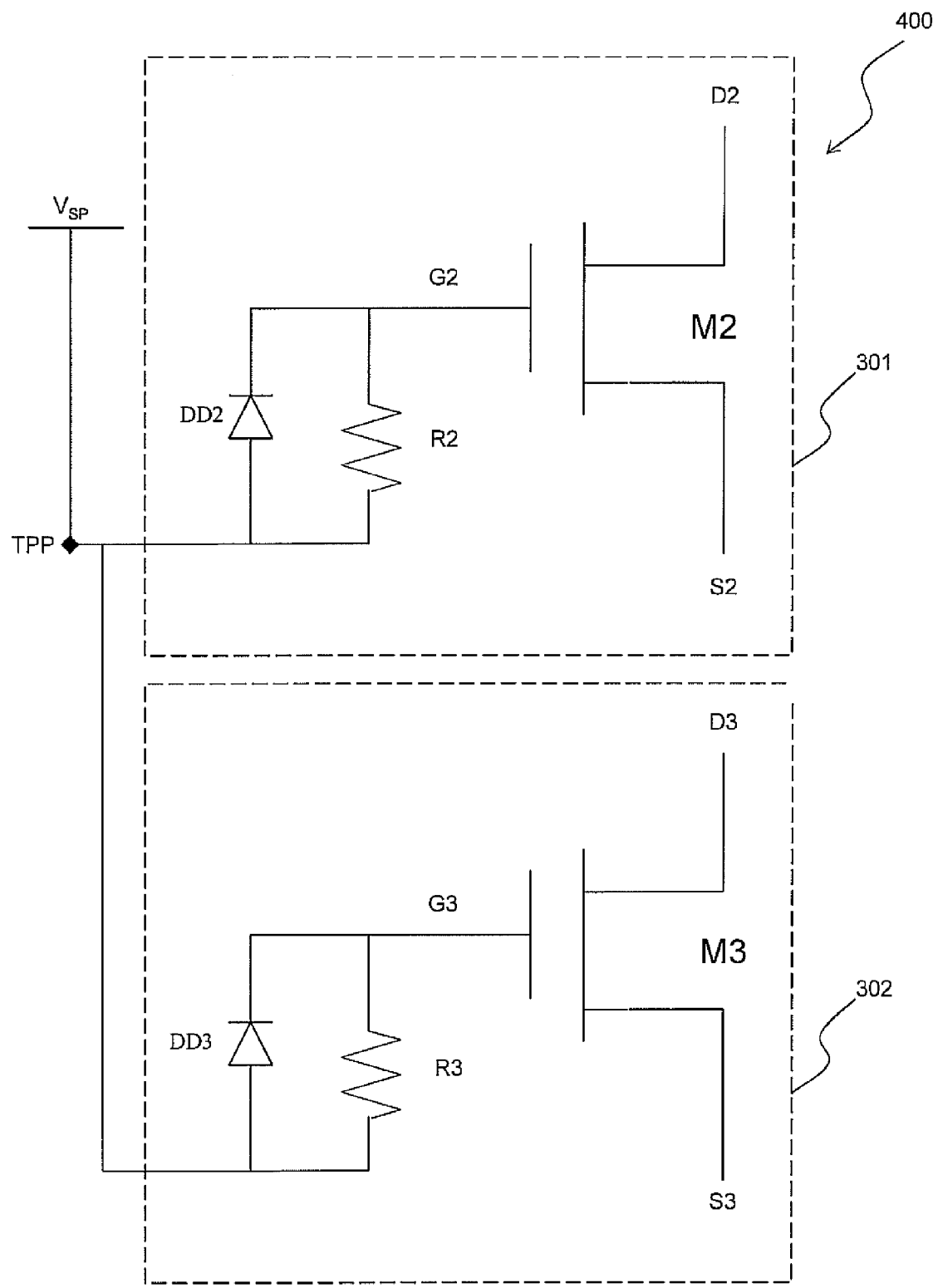
FIG. 5 is a schematic diagram showing an electronic system comprising two electronic circuits according to the second embodiment.

Referring to FIG. 5, it is shown an electronic system 400 which includes two electronic circuits 301, 302 operating in the test phase, wherein the circuit 302 is similar to the circuit 301 according to the second embodiment. The electronic system 400 comprises only one test pad TPP (not electrically connected to the source terminals S2, S3) such to receive the voltage values $V_{SP}$ for performing the test of the gate oxide when the circuits 301, 302 are such to operate in the test phase (as shown in FIG. 5) and such to be electrically connected to the source terminals S2, S3 when the circuits 301, 302 are such to operate in the normal operation phase (not shown in FIG. 5 for the sake of simplicity). Diodes DD2 and DD3 have the function of allowing (in the test phase) to perform the test of the gate oxide of a plurality of MOS transistors (M2, M3) using only one test pad TPP for driving a plurality of gate terminals (G2, G3).

Figure 6:
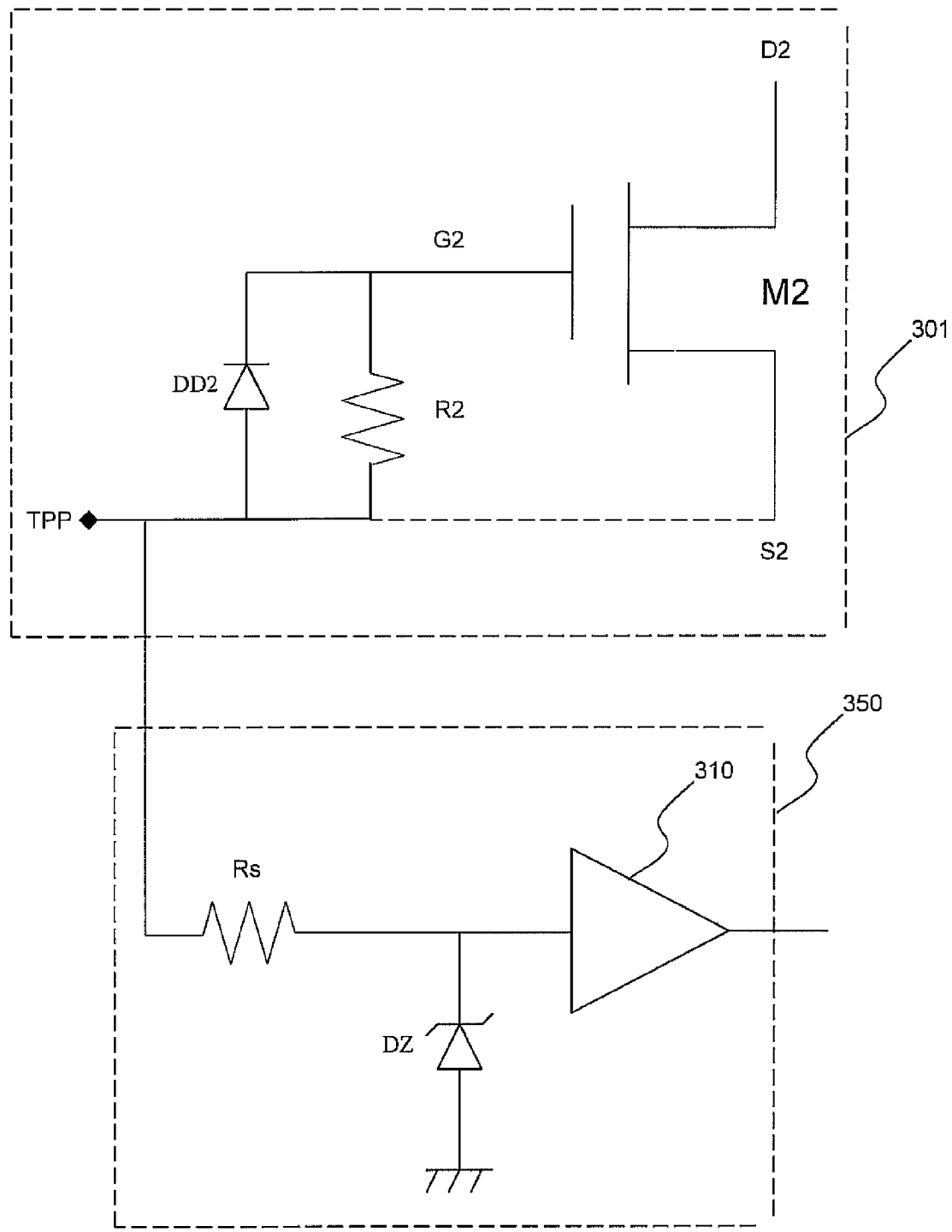
FIG. 6 is a schematic diagram showing an electronic circuit for detecting the connection of a pad to the source terminal of a MOS transistor.

Referring to FIG. 6, it shows a detection circuit 350 having the function of verifying the electric connection of the test pad TPP of the second embodiment to the source terminal of the MOS transistor M2. The detection circuit 350 comprises a resistor Rs having a first terminal connected to the test pad TPP, it comprises a protection circuit (for example a Zener diode DZ) connected between a second terminal of the resistor Rs and ground, and it comprises a voltage comparator 310 (for example an inverting Schmitt trigger) having an input terminal connected to the second terminal of the resistor Rs and having an output terminal which assumes logic-type values. When the electronic circuit 301 is in the normal operation phase and in case of presence of the supply voltage of the electronic circuit 301, if the test terminal TPP is connected to the source terminal S2, the output of the voltage comparator 310 remains constant at the high logic value. If, on the contrary, the test terminal TPP is electrically disconnected from the source terminal S2, the voltage value of the input terminal of the voltage comparator 310 depends on the voltage value of the gate terminal G2 and thus the output of the voltage comparator 310 switches between the high logic value and the low logic value as a function of the conduction or interdiction state of the MOS transistor M2.

Figure 7A:
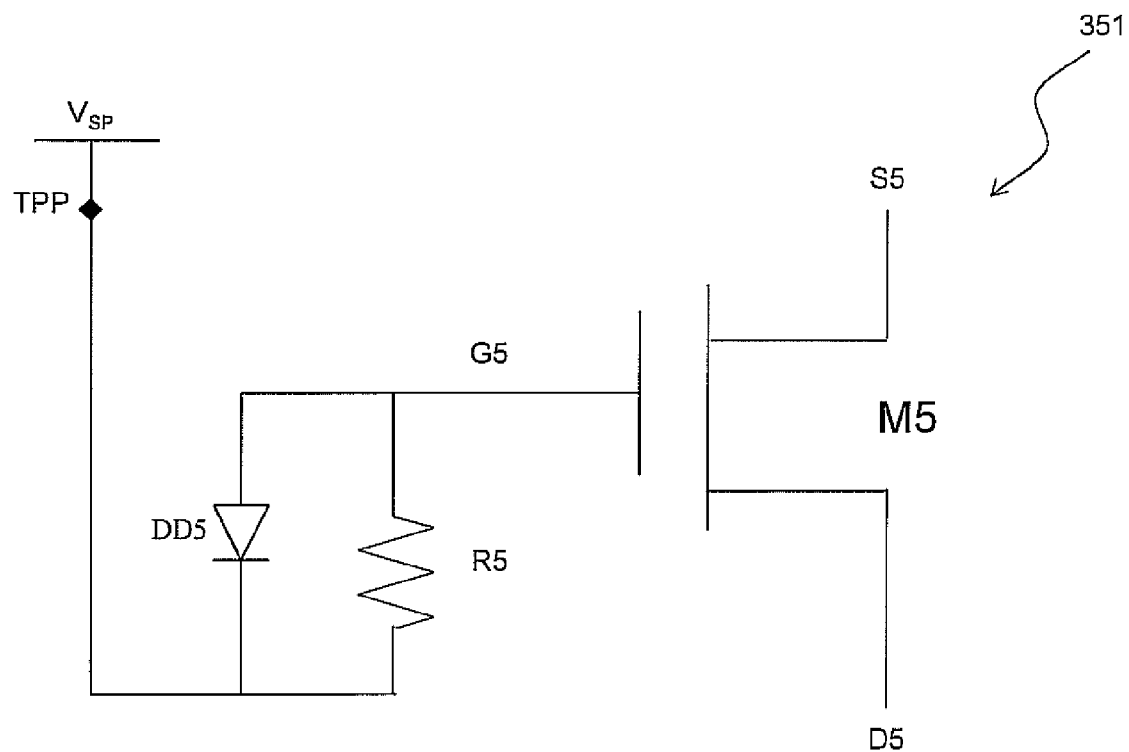
FIGS. 7A and 7B are schematic diagrams showing an electronic circuit for testing and keeping a MOS transistor switched-off according to a variant of the second embodiment.
Figure 7B:
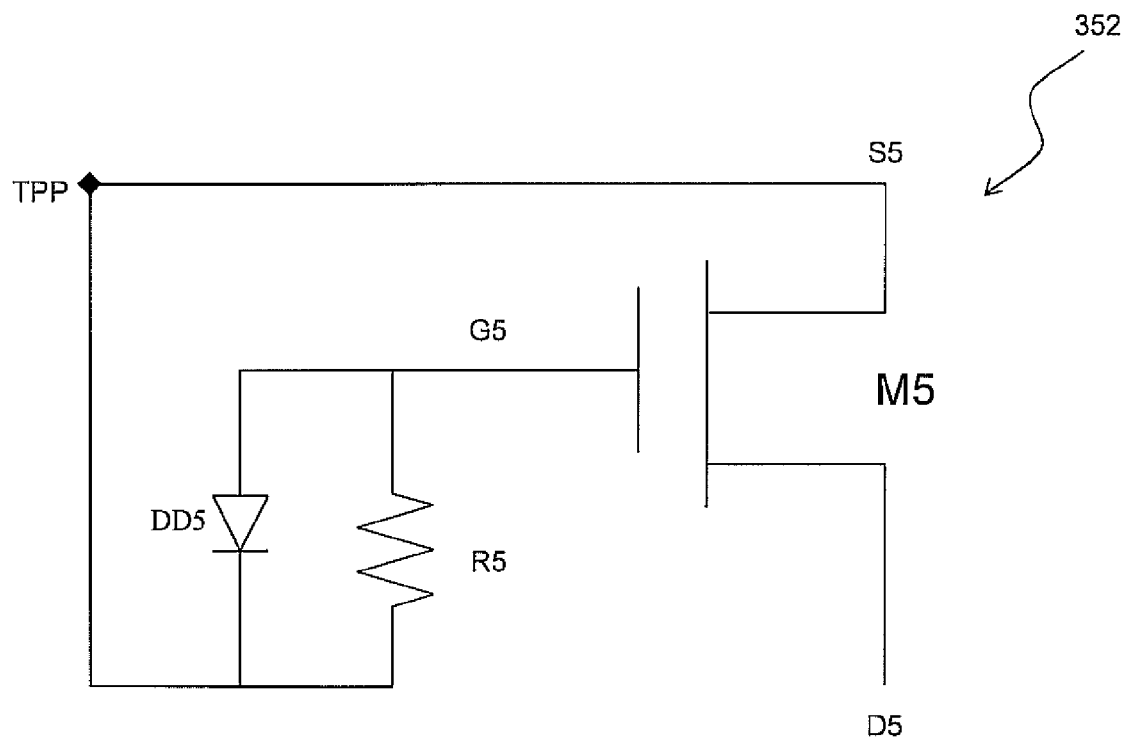

It should be noted that for the purpose of explaining the embodiments for the sake of simplicity it is considered the case wherein the MOS transistor of the first and of the second embodiments of the invention is of the n-channel type, but the embodiments may be applied also to the case wherein the MOS transistor is of the p-channel type. For example, FIGS. 7A and 7B show the electronic circuits 351, 352, which are a variant of the second embodiment of the invention, wherein a p-channel MOS transistor M5 is used (instead of n-channel MOS transistor M2). The electronic circuit 351 is such to operate in the test phase and it has a operation similar to the electronic circuit 301. The electronic circuit 352 is such to operate in the normal operation and it has a operation similar to the electronic circuit 302.

It should be further noted that for the purpose of explaining the embodiments and for the sake of simplicity it is considered the case wherein the gate of the MOS transistor has an insulating layer formed by oxide to indicate a silicon dioxide layer interposed between the metal and the semiconductor (either n-type or p-type). More in general, the embodiments may be applied also to a transistor wherein the insulating layer (interposed between the metal layer and the semiconductor material) is different from the silicon dioxide, such as for example silicon nitride, silicon oxynitride or hafnium oxide.

It should be also noted that for the purpose of explaining the embodiments for the sake of simplicity it is considered the case wherein the transistor comprises a metal layer which forms the gate terminal, but more in general the embodiments may be applied to a transistor which comprises a conductive layer which forms the gate terminal, such as for example polysilicon.

Therefore more in general the embodiments may be applied to a transistor which comprises an insulating layer interposed between a conductive layer (which forms the gate terminal) and a layer of p-doped or n-doped semiconductor material.

It is an object of the present embodiments to also provide a method for testing and switching-off a transistor. The method includes: providing the transistor having a gate terminal, a source terminal and a drain terminal; providing an auxiliary pad; providing a resistor having a first terminal connected to the gate terminal and having a second terminal connected to the auxiliary pad; activating a test phase, wherein the auxiliary pad is electrically floating; receiving a test signal and performing the test of the transistor; electrically connecting the auxiliary pad to a voltage value smaller than the sum of the voltage value of the source terminal with the threshold voltage value of the transistor; activating a normal phase and driving the gate terminal of the transistor as a function of a supply voltage; after occurring a lack of the supply voltage, in case of an increase of the voltage value on the drain terminal and in case of switching-on the transistor, discharging the voltage value of the gate terminal across the resistor and switching-off the transistor.

That which is claimed:

1. An electronic circuit comprising:
   a transistor having a gate terminal, a source terminal and a drain terminal;
   an auxiliary pad; and
   a resistor coupled between the gate terminal and the auxiliary pad;
   the auxiliary pad being configured to be electrically floating when the electronic circuit is operating in a test phase and is receiving a test signal for performing a test of the transistor;
   the auxiliary pad being configured to receive a voltage value smaller than a sum of a voltage value of the source terminal and a threshold voltage value of the transistor when the electronic circuit is operating in an operation phase and is receiving a supply voltage.

2. The electronic circuit according to claim 1, further comprising:
   a test pad configured to receive the test signal; and
   a diode having a cathode coupled to the gate terminal and an anode coupled to the test pad.

3. The electronic circuit according to claim 1, further comprising a diode having a cathode coupled to the gate terminal and an anode coupled to the auxiliary pad; wherein the auxiliary pad is further configured, when the electronic circuit is operating in the test phase, to receive the test signal for performing the test of the transistor.

4. The electronic circuit according to claim 1, wherein the auxiliary pad is configured to be electrically coupled to the source terminal of the transistor in the operation phase.

5. The electronic circuit according to claim 1, wherein the auxiliary pad is configured to be electrically coupled with a bonding wire.

6. The electronic circuit according to claim 1, wherein the transistor comprises an re-channel MOS transistor.

7. The electronic circuit according to claim 1, wherein the transistor comprises a p-channel MOS transistor.

8. The electronic circuit according to claim 1, wherein the transistor comprises a lateral diffused MOS transistor.

9. An electronic system comprising: an auxiliary pad; and at least two electronic circuits each comprising a transistor having a gate terminal, a source terminal and a drain terminal, a resistor coupled between the gate terminal and the auxiliary pad, and a diode having a cathode coupled to the gate terminal and an anode coupled to the auxiliary pad; the anodes of the diodes of the least two electronic circuits being coupled to each other and to the auxiliary pad; the auxiliary pad being configured to be electrically floating when the electronic circuits are operating in a test phase and to receive a test signal for performing a test of the transistors; and the auxiliary pad being configured to receive a voltage value smaller than the sum of the voltage value of the source terminals and a threshold voltage value of the transistors when the electronic circuits are operating in a operation phase and are receiving a supply voltage.

10. The electronic system according to claim 9, wherein the auxiliary pad is configured to be electrically coupled to the source terminals of the transistors in the operation phase.

11. The electronic system according to claim 9, wherein the transistors comprise n-channel MOS transistors.

12. The electronic system according to claim 9, wherein the transistors comprise p-channel MOS transistor.

13. The electronic system according to claim 9, wherein the transistors comprise lateral diffused MOS transistors.

14. An integrated circuit comprising:
    at least one electronic circuit comprising:
      a transistor having a gate terminal, a source terminal and a drain terminal,
      an auxiliary pad, and
      a resistor coupled between the gate terminal and the auxiliary pad,
      the auxiliary pad being configured to be electrically floating when the electronic circuit is operating in a test phase and is receiving a test signal for performing a test of the transistor,
      the auxiliary pad being configured to receive a voltage value smaller than a sum of a voltage value of the source terminal and a threshold voltage value of the transistor when the electronic circuit is operating in an operation phase and is receiving a supply voltage.

15. The integrated circuit according to claim 14, wherein the electronic circuit further comprises:
    a test pad configured to receive the test signal; and
    a diode having a cathode coupled to the gate terminal and an anode coupled to the test pad.

16. The integrated circuit according to claim 14, wherein the electronic circuit further comprises a diode having a cathode coupled to the gate terminal and an anode coupled to the auxiliary pad; wherein the auxiliary pad is further configured, when the electronic circuit is operating in the test phase, to receive the test signal for performing the test of the transistor.

17. The integrated circuit according to claim 14, wherein the auxiliary pad is configured to be electrically coupled to the source terminal of the transistor in the operation phase.

18. A method for testing and switching-off a transistor having a gate terminal, a source terminal and a drain terminal, the method comprising:
    coupling a resistor between the gate terminal and an auxiliary pad;
    activating a test phase, wherein the auxiliary pad is electrically floating;
    receiving a test signal and performing a test of the transistor;
    receiving, at the auxiliary pad, a voltage value smaller than the sum of the voltage value of the source terminal and a threshold voltage value of the transistor;
    activating an operation phase and driving the gate terminal of the transistor based upon a supply voltage; and
    after a change in the supply voltage, in case of an increase of the voltage value on the drain terminal and in case of switching-on of the transistor, discharging the voltage value of the gate terminal across the resistor and switching-off the transistor.

19. The method according to claim 18, wherein a test pad is configured to receive the test signal, and a diode has a cathode coupled to the gate terminal and an anode coupled to the test pad.

20. The method according to claim 18, wherein a diode has a cathode coupled to the gate terminal and an anode coupled to the auxiliary pad; and wherein the auxiliary pad is further configured, when the electronic circuit is operating in the test phase, to receive the test signal for performing the test of the transistor.

21. The method according to claim 18, further comprising electrically connecting the auxiliary pad to the source terminal of the transistor in the operation phase.

* * * * *

UNITED STATES PATENT AND TRADEMARK OFFICE
CERTIFICATE OF CORRECTION

PATENT NO. : 9,024,652 B2  
APPLICATION NO. : 13/530419  
DATED : May 5, 2015  
INVENTOR(S) : Amighini et al.

Page 1 of 1

It is certified that error appears in the above-identified patent and that said Letters Patent is hereby corrected as shown below:

In the Claims

Column 9, Line 47     Delete: "re-channel"
                      Insert: --n-channel--

Signed and Sealed this
Third Day of November, 2015

Michelle K. Lee
*Director of the United States Patent and Trademark Office*